(12) United States Patent
Liu et al.

(10) Patent No.: US 12,396,290 B2
(45) Date of Patent: Aug. 19, 2025

(54) SOLAR CELL AND MANUFACTURING METHOD THEREOF, AND PHOTOVOLTAIC SYSTEM

(71) Applicant: TRINA SOLAR CO., LTD., Changzhou (CN)

(72) Inventors: Chengfa Liu, Changzhou (CN); Yang Zou, Changzhou (CN); Kunzhou Wang, Changzhou (CN); Wanli Li, Changzhou (CN); Yaqian Zhang, Changzhou (CN); Xiaopeng Wu, Changzhou (CN); Shuai Zhang, Changzhou (CN); Yugang Lu, Changzhou (CN); Hong Chen, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/757,670

(22) Filed: Jun. 28, 2024

(65) Prior Publication Data

US 2024/0413255 A1 Dec. 12, 2024

(30) Foreign Application Priority Data

Nov. 22, 2023 (CN) .......................... 202311561740.8

(51) Int. Cl.
*H10F 77/20* (2025.01)
*H10F 71/00* (2025.01)
(Continued)

(52) U.S. Cl.
CPC ........... *H10F 77/215* (2025.01); *H10F 71/00* (2025.01); *H10F 71/1221* (2025.01);
(Continued)

(58) Field of Classification Search
None
See application file for complete search history.

(56) References Cited

U.S. PATENT DOCUMENTS

| | | | | |
|---|---|---|---|---|
| 2009/0104461 | A1* | 4/2009 | Young | H01B 1/16 252/514 |
| 2016/0284898 | A1* | 9/2016 | Pei | H10F 77/219 |

FOREIGN PATENT DOCUMENTS

| | | |
|---|---|---|
| CN | 115084299 A | 9/2022 |
| CN | 115241298 A | 10/2022 |

(Continued)

OTHER PUBLICATIONS

Tepner et al., "Printing technologies for silicon solar cell metallization: A comprehensive review," *Progress in Photovoltaics: Research and Applications*, 31, 557-590, Jan. 27, 2023, 34 pages.

(Continued)

*Primary Examiner* — Eli S Mekhlin
(74) *Attorney, Agent, or Firm* — MARSHALL, GERSTEIN & BORUN LLP

(57) ABSTRACT

A solar cell and a manufacturing method thereof, and a photovoltaic system. The solar cell includes: a substrate layer including a first surface and a second surface arranged oppositely along a thickness direction thereof; a tunnel oxide layer, a first doped polysilicon layer, and a first passivation layer sequentially arranged on the first surface of the substrate layer in a direction gradually away from the substrate layer; and a first finger electrode layer, at least one of the first fingers being arranged in first connection holes, bottoms of the first connection holes being located in the first doped polysilicon layer, and the first fingers passing through the first connection holes corresponding thereto to be electrically connected to the first doped polysilicon layer; and in the first direction, widths of the first connection holes being all less than widths of the first fingers corresponding to the (Continued)

first connection holes. While ensuring good electrical connection, the solar cell causes less damage and recombination to a passivation structure of the solar cell, and has high photoelectric conversion efficiency.

17 Claims, 7 Drawing Sheets

(51) Int. Cl.
  *H10F 77/1223* (2025.01)
  *H10F 77/164* (2025.01)
  *H10F 77/30* (2025.01)
(52) U.S. Cl.
  CPC ..... *H10F 77/1223* (2025.01); *H10F 77/1642* (2025.01); *H10F 77/315* (2025.01)

(56) References Cited

FOREIGN PATENT DOCUMENTS

| | | |
|---|---|---|
| CN | 115548142 A | 12/2022 |
| CN | 115985980 A | 4/2023 |
| CN | 116487482 A | 7/2023 |
| CN | 116722057 A | 9/2023 |
| CN | 117038753 A | 11/2023 |
| JP | 2002176186 A | 6/2002 |
| JP | 2013030815 A | 2/2013 |
| JP | 2016189444 A | 11/2016 |
| JP | 7274252 B1 | 5/2023 |
| WO | WO-2017/163498 A1 | 9/2017 |
| WO | WO-2019/021545 A1 | 1/2019 |

OTHER PUBLICATIONS

Watanabe et al., "Influence of tellurite glass on reaction between $Si_3N_4$ anti-reflection coating film and Ag paste for electrodes in Si solar cells," *Journal of the Ceramic Society of Japan*, 124(3), 218-222, Mar. 1, 2016, 5 pages.

Office Action, Japanese patent application No. 2024-106344, dated Jul. 31, 2024.

Japanese Office Action, Japanese Patent Application No. 2024-106344, dated Dec. 10, 2024.

Extended European Search Report, European Patent Application No. 24180815.3, dated Jan. 7, 2025.

\* cited by examiner

SOLAR CELL AND MANUFACTURING METHOD THEREOF, AND PHOTOVOLTAIC SYSTEM

CROSS-REFERENCE TO RELATED APPLICATION

This application claims priority to Chinese patent application No. 2023115617408, filed on Nov. 22, 2023, and titled "SOLAR CELL AND MANUFACTURING METHOD THEREOF, AND PHOTOVOLTAIC SYSTEM", the content of which is hereby incorporated herein in its entirety by reference.

TECHNICAL FIELD

The present disclosure relates to the field of solar cell technologies, and in particular, to a solar cell and a manufacturing method thereof, and a photovoltaic system.

BACKGROUND

Tunnel oxide passivated contact (TOPCon) cells are solar cells using an ultra-thin oxide layer as a passivation layer structure. An ultra-thin tunnel oxide layer and a thin layer of doped polysilicon together form a passivation contact structure, which can effectively reduce surface recombination and metal contact recombination and provide good surface passivation for a back surface of a silicon wafer, and can effectively reduce recombination current density on the back surface and improve photoelectric conversion efficiency of the cells.

In traditional TOPCon cells, part of a doped polysilicon layer is exposed through etching or laser ablation, and then electrodes are manufactured to form ohmic contact (or electrical connection) with the doped polysilicon layer. However, the etching or laser ablation process causes greater damage to a passivation layer and an antireflection layer, which has a greater impact on performance improvement of the TOPCon cells.

SUMMARY

Based on this, there is a need to provide a solar cell that reduces damage and recombination to the passivation layer and the antireflection layer and has high photoelectric conversion efficiency and a manufacturing method thereof.

In an aspect of the present disclosure, a solar cell is provided, including: a substrate layer including a first surface and a second surface arranged oppositely along a thickness direction thereof; a tunnel oxide layer, a first doped polysilicon layer, and a first passivation layer sequentially arranged on the first surface of the substrate layer in a direction gradually away from the substrate layer; and a first finger electrode layer, the first finger electrode layer including a plurality of first fingers sequentially arranged at intervals along a first direction; at least one of the first fingers being arranged in first connection holes, bottoms of the first connection holes being located in the first doped polysilicon layer, and the first fingers passing through the first connection holes corresponding thereto to be electrically connected to the first doped polysilicon layer; and in the first direction, widths of the first connection holes being all less than widths of the first fingers corresponding to the first connection holes.

In some implementations, a projection area of each of the first connection holes on the first surface is independently from a square nanometer level to a square micron level.

In some implementations, the projection area of each of the first connection holes on the first surface independently ranges from 10 $nm^2$ to 10 $\mu m^2$.

In some implementations, based on a projection area on the first surface, the first fingers per 1 $mm^2$ are electrically connected to the first doped polysilicon layer through 1 to 100,000 first connection holes.

In some implementations, at least one second connection hole is provided in the first passivation layer; the first fingers pass through the second connection holes and the first connection holes corresponding thereto to be electrically connected to the first doped polysilicon layer; and in the first direction, widths of the second connection holes are all less than or equal to widths of the first fingers corresponding to the second connection holes; and projections of the first connection holes on the first surface all fall within a projection range of the second connection holes on the first surface.

In some implementations, a number of the second connection holes is less than that of the first connection holes.

In some implementations, a projection area of each of the second connection holes on the first surface is independently from a square nanometer level to a square micron level.

In some implementations, the projection area of each of the second connection holes on the first surface independently ranges from 10 $nm^2$ to 10 $\mu m^2$.

In some implementations, a thickness of the first passivation layer ranges from 40 nm to 100 nm.

In some implementations, a thickness of the first doped polysilicon layer ranges from 10 nm to 200 nm.

In some implementations, the first solar cell further includes: a boron doped layer, a second passivation layer, and a second finger electrode layer; the boron doped layer and the second passivation layer being sequentially arranged on the second surface of the substrate layer in a direction gradually away from the substrate layer, and the second finger electrode layer including a plurality of second fingers arranged at intervals along a second direction; and at least one of the second fingers being arranged in third connection holes, bottoms of the third connection holes being located in the boron doped layer, and the second fingers passing through the third connection holes corresponding thereto to be electrically connected to the boron doped layer; and in the second direction, widths of the third connection holes being all less than widths of the second fingers corresponding to the third connection holes.

In some implementations, a projection area of each of the third connection holes on the second surface is independently from a square nanometer level to a square micron level.

In some implementations, the projection area of each of the third connection holes on the second surface independently ranges from 10 $nm^2$ to 10 $\mu m^2$.

In some implementations, based on a projection area on the second surface, the second fingers per 1 $mm^2$ are electrically connected to the boron doped layer through 1 to 100,000 third connection holes.

In some implementations, at least one fourth connection hole is provided in the second passivation layer, and the second fingers pass through the fourth connection holes and the third connection holes corresponding thereto to be electrically connected to the boron doped layer; and in the second direction, widths of the fourth connection holes are all less than or equal to widths of the second fingers corresponding to the third connection holes; and projections of the third connection holes on the second surface all fall within a projection range of the fourth connection holes on the second surface.

In some implementations, a number of the fourth connection holes is less than that of the third connection holes.

In some implementations, a projection area of each of the fourth connection holes on the second surface is independently from a square nanometer level to a square micron level.

In some implementations, the projection area of each of the fourth connection holes on the second surface independently ranges from 10 $nm^2$ to 10 $\mu m^2$.

In some implementations, a thickness of the second passivation layer ranges from 2 nm to 20 nm.

In some implementations, the second fingers and the substrate layer are at least isolated by the boron doped layer.

In some implementations, the solar cell further includes: an antireflection layer; the antireflection layer being arranged on a side of the second passivation layer away from the substrate layer.

In some implementations, a thickness of the antireflection layer ranges from 40 nm to 100 nm.

In a second aspect, the present disclosure further provides a manufacturing method for a solar cell, including the following steps: sequentially forming a tunnel oxide layer, a first doped polysilicon layer, and a first passivation layer on a first surface of a substrate layer; printing a first pattern on a surface of the first passivation layer away from the substrate layer, a material of the first pattern including a first metal slurry; the first pattern including a plurality of first finger bars sequentially arranged at intervals along a first direction; drying the first pattern; and sintering the dried first pattern, and manufacturing a first finger electrode layer, the first finger electrode layer including a plurality of first fingers sequentially arranged at intervals along the first direction, each of the first fingers corresponding to one of the first finger bars; wherein, in the sintering, the material of the first pattern corrodes the first passivation layer and the first doped polysilicon layer, at least one first connection hole is etched in the first passivation layer and the first doped polysilicon layer at a position corresponding to at least one of the first finger bars, bottoms of the first connection holes are located in the first doped polysilicon layer, and the manufactured first fingers pass through the first connection holes corresponding thereto to be in contact with the first doped polysilicon layer.

In some implementations, a peak temperature of the sintering ranges from 700° C. to 900° C.

In a third aspect, the present disclosure further provides a photovoltaic system, including the solar cell described above or a solar cell manufactured according to the manufacturing method for a solar cell described above.

The present disclosure has at least the following beneficial effects.

In the solar cell provided in the implementations of the present disclosure, the first fingers contact the first doped polysilicon layer through connection holes in the first passivation layer, and sizes of the first connection holes are all smaller than those of the first fingers, which causes less damage and recombination to a passivation structure of the solar cell while ensuring good electrical contact. Compared with traditional solar cells, the solar cell provided in the implementations of the present disclosure has higher photoelectric conversion efficiency.

Figure 1:
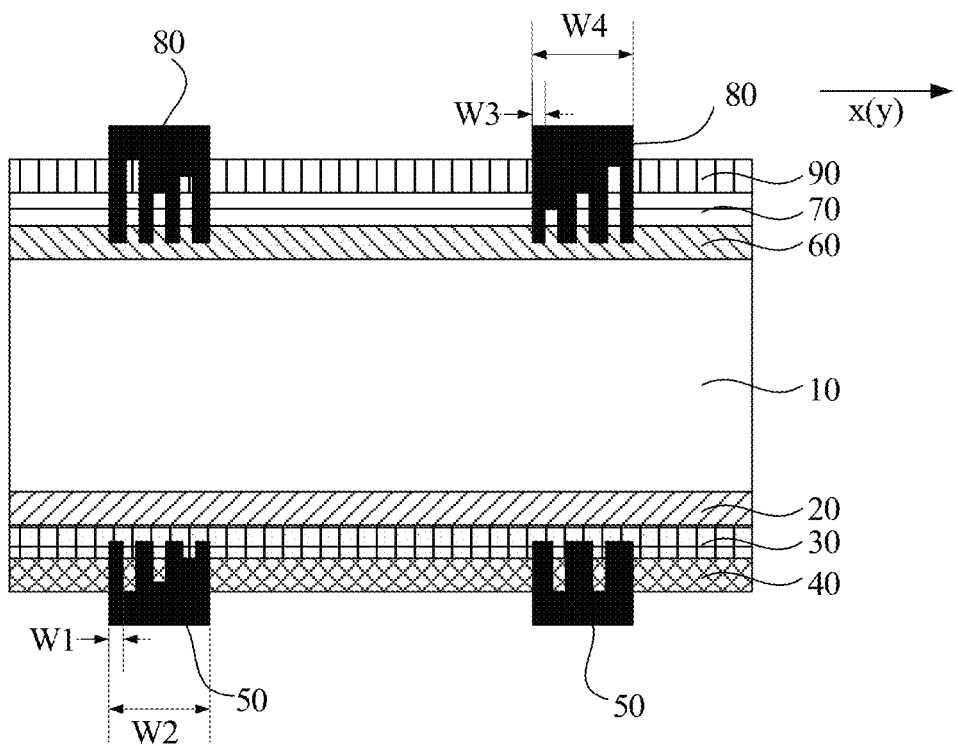
FIG. 1 is a schematic structural diagram of a solar cell according to an embodiment of the present disclosure.

REFERENCE SIGNS 1. solar cell; 10. substrate layer; 20. tunnel oxide layer; 30. first doped polysilicon layer; 40. first passivation layer; 50. first finger; 501. first finger corresponding to second connection hole; 502. first finger corresponding to fifth hole; 60. boron doped layer; 70. second passivation layer; 80. second finger; 801 second fingers corresponding to fourth connection hole; 802. second finger corresponding to sixth hole; 90. antireflection layer.

DETAILED DESCRIPTION

To facilitate understanding of the present disclosure, a more comprehensive description of the present disclosure will be given below with reference to the relevant accompanying drawings. Preferred embodiments of the present disclosure are given in the drawings. However, the present disclosure may be implemented in many different forms and is not limited to the embodiments described herein. Rather, these embodiments are provided to make the contents disclosed in the present disclosure more fully understood.

In the description of the present disclosure, the orientation or position relationships indicated by the terms "central", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential", and the like are based on the orientation or position relationships shown in the accompanying drawings and are intended to facilitate the description of the present disclosure and simplify the description only, rather than indicating or implying that the apparatus or element referred to must have a particular orientation or be constructed and operated in a particular orientation, and therefore are not to be interpreted as limiting the present disclosure.

In addition, the terms "first" and "second" are used for descriptive purposes only, which cannot be construed as indicating or implying a relative importance, or implicitly specifying the number of the indicated technical features. Thus, the features defined with "first" and "second" may explicitly or implicitly include one or more features. In the description of the present disclosure, "a plurality of" means two or more, for example, two or three, unless otherwise defined explicitly and specifically.

In the present disclosure, unless otherwise specified and defined explicitly, the terms "mount", "connect", "join", and "fix" should be understood in a broad sense. For example, they may refer to a fixed connection, a detachable connection, or an integral connection; may refer to a mechanical connection or electrical connection; and may refer to a direct connection, an indirect connection via an intermediate medium, an internal connection between two elements, or interaction between two elements. Those of ordinary skill in the art can understand specific meanings of these terms in the present disclosure according to specific situations.

It should be noted that when one element is referred to as "fixed to" another element, it may be directly disposed on the another element or an intermediate element may exist. When one element is considered to be "connected to" another element, it may be directly connected to the another element or an intermediate element may co-exist.

In the present disclosure, unless otherwise specified and defined explicitly, the expression a first feature being "on" or "under" a second feature may be the case that the first feature is in direct contact with the second feature, or the first feature is in indirect contact with the second feature via an intermediate medium. Furthermore, the expression the first feature being "over", "above" and "on top of" the second feature may be the case that the first feature is directly above or obliquely above the second feature, or only means that the level of the first feature is higher than that of the second feature. The expression the first feature being "below", "underneath" or "under" the second feature may be the case that the first feature is directly underneath or obliquely underneath the second feature, or only means that the level of the first feature is lower than that of the second feature.

In addition, the accompanying drawings are not drawn to 1:1 scale, and relative sizes of various elements in the accompanying drawings are drawn by way of examples only to facilitate understanding of the present disclosure, and not necessarily to true scale. The scales are in the drawings do not constitute a limitation on the present disclosure.

Unless defined otherwise, all technical and scientific terms used herein have the same meanings as would generally understood by those skilled in the technical field of the present disclosure. The terms used herein in the specification of the present disclosure are for the purpose of describing specific embodiments only, and are not intended to limit the present disclosure. The term "and/or" used herein includes any and all combinations of one or more related listed items.

In the present disclosure, ohmic contact has a same meaning as electrical connection. Preferably, the electrical connection is physical contact. That is, the electrical connection refers to circuit connection of physical contact, rather than wireless communication signal connection.

Figure 2:
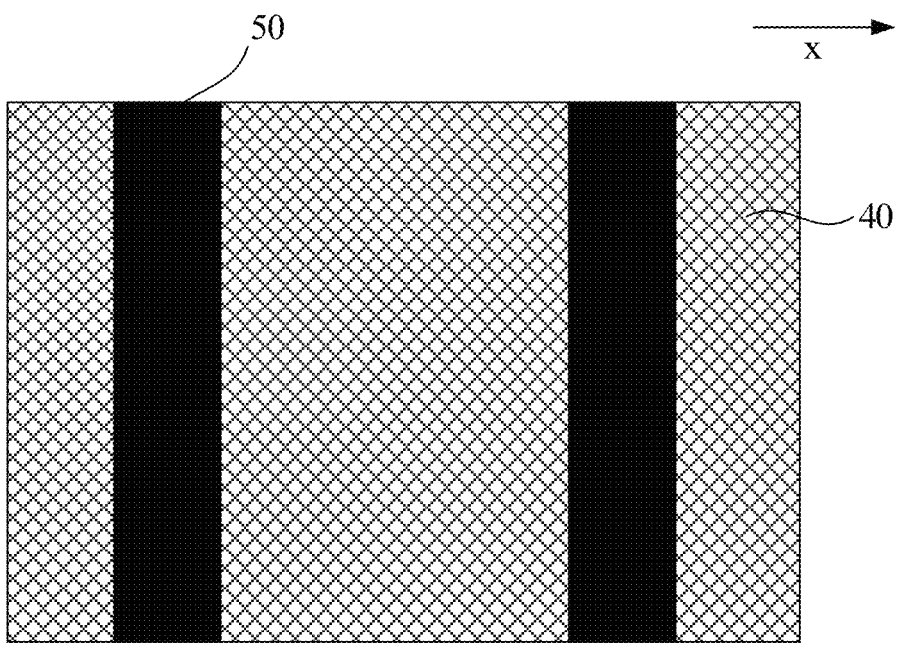
FIG. 2 is a schematic plan view of the solar cell shown in FIG. 1 in a direction from a first surface to a second surface.

Referring to FIG. 1 and FIG. 2, an implementation of the present disclosure provides a solar cell 1, including a substrate layer 10, a tunnel oxide layer 20, a first doped polysilicon layer 30, a first passivation layer 40, and a first finger 50 layer.

The substrate layer 10 includes a first surface and a second surface arranged oppositely along a thickness direction thereof.

The tunnel oxide layer 20, the first doped polysilicon layer 30, and the first passivation layer 40 are sequentially arranged on the first surface of the substrate layer 10 in a direction gradually away from the substrate layer 10.

The first finger electrode layer includes a plurality of first fingers 50 sequentially arranged at intervals along a first direction x.

Figure 3:
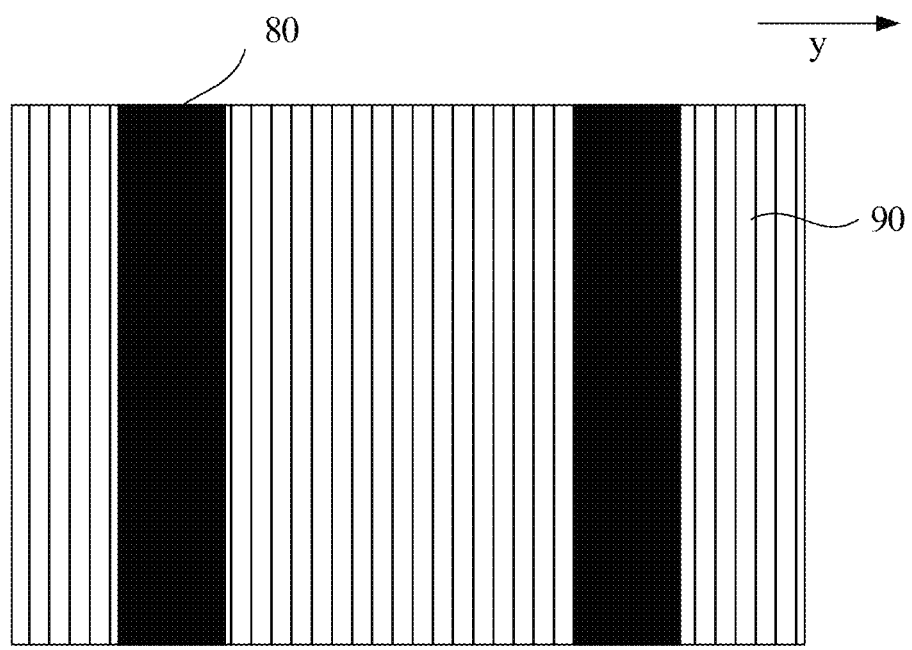
FIG. 3 is a schematic plan view of the solar cell shown in FIG. 1 in a direction from the second surface to the first surface.

At least one of the first fingers 50 is arranged in first connection holes, bottoms of the first connection holes are located in the first doped polysilicon layer 30 (since the first fingers and the first connection holes form a mosaic structure, the first connection holes are not shown in FIG. 1 to FIG. 3), and the first fingers 50 pass through the first connection holes corresponding thereto to be electrically connected to the first doped polysilicon layer 30. In the first direction x, widths W1 of the first connection holes are all less than widths W2 of the first fingers 50 corresponding to the first connection holes.

It may be understood that in the present disclosure, along the thickness direction, the first connection hole runs through all of the first passivation layer 40 and runs through part of the first doped polysilicon layer 30.

In the solar cell 1 described above, the first fingers 50 contact the first doped polysilicon layer 30 through the first connection holes, and sizes of the first connection holes are all smaller than those of the first fingers 50, which causes less damage and recombination to a passivation structure of the solar cell 1 while ensuring good electrical contact. Moreover, the first fingers 50 may not pass through the first doped polysilicon layer 30 to be connected to the tunnel oxide layer 20, which further reduces the damage of the first finger electrode layer to the passivation structure of the solar cell 1 and further prevents damage and recombination to the passivation structure. Compared with traditional solar cells 1, the solar cell 1 provided in the implementations of the present disclosure has higher photoelectric conversion efficiency.

In some embodiments, a projection area of each of the first connection holes on the first surface of the substrate layer 10 is independently from a square nanometer level to a square micron level. Further, the projection area of each of the first connection holes on the first surface of the substrate layer 10 independently ranges from 10 nm$^2$ to 10 μm$^2$. The projection area of the first connection hole on the first surface of the substrate layer 10 is controlled to be from the square nanometer level to the square micron level, and the first connection hole has a smaller size, which can further reduce damage and recombination to the first passivation layer 40 while ensuring good ohmic contact/electrical connection between the first finger 50 and the first doped polysilicon layer 30, and can improve photoelectric conversion efficiency compared with the traditional solar cells. Optionally, the projection area of each of the first connection holes on the first surface of the substrate layer 10 is 10 nm$^2$, 50 nm$^2$, 100 nm$^2$, 500 nm$^2$, 0.1 μm$^2$, 1 μm$^2$, 10 μm$^2$ or within a range of any of the above values.

In some embodiments, based on a projection area on the first surface of the substrate layer 10, the first fingers 50 per 1 mm$^2$ are electrically connected to the first doped polysilicon layer 30 through 1 to 100,000 first connection holes. Optionally, based on a projection area on the first surface of the substrate layer 10, the first fingers 50 per 1 mm$^2$ are electrically connected to the first doped polysilicon layer 30 through the first connection hole whose number is 1, 10, 100, 200, 500, 1,000, 2,000, 3,000, 5,000, 8,000, 10,000, 20,000, 30,000, 50,000, 80,000, 100,000 or within a range of any of the above values.

In some embodiments, a thickness of the first passivation layer 40 ranges from 40 nm to 100 nm. Optionally, the thickness of the first passivation layer 40 is 40 nm, 50 nm, 60 nm, 70 nm, 80 nm, 90 nm, 100 nm or within a range of any of the above values.

In some embodiments, a thickness of the first doped polysilicon layer 30 ranges from 10 nm to 200 nm. Optionally, the thickness of the first passivation layer 30 is 10 nm, 20 nm, 50 nm, 100 nm, 150 nm, 200 nm or within a range of any of the above values.

Referring to FIG. 1 and FIG. 3, in some embodiments, the solar cell 1 further includes: a boron doped layer 60, a second passivation layer 70, and a second finger electrode layer.

The boron doped layer 60 and the second passivation layer 70 are sequentially arranged on the second surface of the substrate layer 10 in a direction gradually away from the substrate layer 10, and the second finger electrode layer includes a plurality of second fingers 80 arranged at intervals along a second direction y.

In some embodiments, a thickness of the second passivation layer 70 ranges from 2 nm to 20 nm. Optionally, the thickness of the second passivation layer 70 is 2 nm, 5 nm, 10 nm, 15 nm, 20 nm or within a range of any of the above values.

Referring to FIG. 4 to FIG. 8, in some embodiments, at least one second connection hole is provided in the first doped polysilicon layer 40 (since the first fingers 50 and the second connection holes form a mosaic structure, the second connection holes are not shown in FIG. 4 to FIG. 8), and the first fingers 50 pass through the second connection holes and the first connection holes corresponding thereto to be electrically connected to the first doped polysilicon layer 30. In the first direction, widths W02 of the second connection holes are all less than or equal to widths W2 of the first fingers 50 corresponding to the second connection holes.

Projections of the first connection holes on the first surface all fall within a projection range of the second connection holes on the first surface.

It may be understood that along the thickness direction, the second connection hole runs through part or all of the first passivation layer 40 but does not run through the first doped polysilicon layer 30. That is, if the first fingers are removed, viewed from the first direction to the second direction, the second connection hole includes at least one first connection hole. Preferably, the second connection hole includes a plurality of first connection holes.

Through the arrangement of the second connection hole, except for a part of the first finger 50 electrically connected to the first doped polysilicon layer 30, the first finger 50 is only partially embedded in the first passivation layer 40 or covers a surface of the first passivation layer 40. Therefore, the first finger 50 causes less damage to the first passivation layer 40.

In some implementations, a number of the second connection holes is less than that of the first connection holes.

In some implementations, a projection area of each of the second connection holes on the first surface of the substrate layer 10 is independently from a square nanometer level to a square micron level. Further, the projection area of each of the second connection holes on the first surface of the substrate layer 10 independently ranges from 10 nm$^2$ to 10 μm$^2$. The projection area of the second connection hole on the first surface of the substrate layer 10 is controlled to be from the square nanometer level to the square micron level, and the second connection hole has a smaller size (larger than the first connection hole), which can further reduce damage and recombination to the first passivation layer 40 while ensuring good ohmic contact/electrical connection between the first finger 50 and the first doped polysilicon layer 30, and can improve photoelectric conversion efficiency compared with the traditional solar cells. Optionally, the projection area of each of the second connection holes on the first surface of the substrate layer 10 is 10 nm$^2$, 20 nm$^2$, 50 nm$^2$, 100 nm$^2$, 500 nm$^2$, 0.1 μm$^2$, 1 μm$^2$, 2 μm$^2$, 3 μm$^2$, 10 μm$^2$ or within a range of any of the above values.

In some embodiments, based on a projection area on the first surface of the substrate layer 10, the first fingers 50 per 1 mm$^2$ are electrically connected to the first doped polysilicon layer 30 through 1 to 100,000 second connection holes. Optionally, based on a projection area on the first surface of the substrate layer 10, the first fingers 50 per 1 mm$^2$ are electrically connected to the first doped polysilicon layer 30 through the second connection hole whose number is 1, 2, 10, 100, 200, 500, 1,000, 2,000, 3,000, 5,000, 8,000, 10,000, 20,000, 30,000, 50,000, 80,000, 100,000 or within a range of any of the above values.

Referring to FIG. 1 to FIG. 8, in some embodiments, for the solar cell 1 including the boron doped layer 60, the second passivation layer 70, and the second finger electrode layer, the boron doped layer 60 and the second passivation layer 70 are sequentially arranged on the second surface of the substrate layer 10 in a direction gradually away from the substrate layer 10, and the second finger electrode layer includes a plurality of second fingers 80 arranged at intervals along a second direction y.

At least one of the second fingers 80 is arranged in third connection holes, bottoms of the third connection holes are located in the boron doped layer 60 (since the second fingers and the third connection holes form a mosaic structure, the third connection holes are not shown in FIG. 1 to FIG. 3), and the second fingers 80 pass through the third connection holes corresponding thereto to be electrically connected to the boron doped layer 60. In the second direction y, widths W3 of the third connection holes are all less than widths W4 of the second fingers 80 corresponding to the third connection holes. In some embodiments shown in FIG. 1, the first direction x and the second direction y are the same. It may be understood that in some other embodiments, the first direction x and the second direction y may be different. For example, the first direction x may be perpendicular to the second direction y.

It may be understood that along the thickness direction, the third connection hole runs through all of the second passivation layer 70 and runs through part of the boron doped layer 60.

In some embodiments, a projection area of each of the third connection holes on the second surface of the substrate layer 10 is independently from a square nanometer level to a square micron level. Further, a projection area of each of the third connection holes on the second surface of the substrate layer 10 independently ranges from 10 nm$^2$ to 10 μm$^2$. The projection area of the third connection hole on the second surface of the substrate layer 10 is controlled to be from the square nanometer level to the square micron level, and the third connection hole has a smaller size, which can further reduce damage and recombination to the second passivation layer 70 while ensuring good ohmic contact/electrical connection between the second finger 80 and the boron doped layer 60, and can improve photoelectric conversion efficiency compared with the traditional solar cells. Optionally, the projection area of each of the third connection holes on the second surface of the substrate layer 10 is 10 nm$^2$, 50 nm$^2$, 100 nm$^2$, 500 nm$^2$, 0.1 μm$^2$, 1 μm$^2$, 10 μm$^2$ or within a range of any of the above values.

In some embodiments, based on a projection area on the second surface of the substrate layer 10, the second fingers 80 per 1 mm$^2$ are electrically connected to the boron doped layer 60 through 1 to 100,000 third connection holes. Optionally, based on a projection area on the second surface of the substrate layer 10, the second fingers 80 per 1 mm$^2$ are electrically connected to the boron doped layer 60 through the third connection hole whose number is 1, 10, 100, 200, 500, 1,000, 2,000, 3,000, 5,000, 8,000, 10,000, 20,000, 30,000, 50,000, 80,000, 100,000 or within a range of any of the above values.

Referring to FIG. 4 to FIG. 8, in some embodiments, at least one fourth connection hole is provided in the second passivation layer 70 (since the second fingers and the fourth connection holes form a mosaic structure, the fourth connection holes are not shown in FIG. 4 to FIG. 8), and the second fingers 80 pass through the fourth connection holes and the third connection holes corresponding thereto to be electrically connected to the boron doped layer 60. In the second direction y, widths W04 of the fourth connection holes are all less than or equal to widths W4 of the second fingers 80 corresponding to the third connection holes.

Projections of the third connection holes on the second surface of the substrate layer 10 all fall within a projection range of the fourth connection holes on the second surface of the substrate layer 10.

It may be understood that along the thickness direction, the fourth connection hole runs through part or all of the second passivation layer 70 but does not run through the boron doped layer 60. That is, if the second fingers are removed, viewed from the second direction to the first direction, the fourth connection hole includes at least one third connection hole. Preferably, the fourth connection hole includes a plurality of third connection holes.

Through the arrangement of the fourth connection hole, except for a part of the second finger 80 electrically connected to the boron doped layer 60, the second finger 80 is only partially embedded in the second passivation layer 70 or located on a side of a surface of the second passivation layer 70 away from the substrate layer 10. Therefore, the second finger 80 causes less damage to the second passivation layer 70.

In some embodiments, a projection area of each of the fourth connection holes on the second surface of the substrate layer 10 is independently from a square nanometer level to a square micron level. Further, the projection area of each of the fourth connection holes on the second surface of the substrate layer 10 independently ranges from 10 $nm^2$ to 10 $\mu m^2$. The projection area of the fourth connection hole on the second surface of the substrate layer 10 is controlled to be from the square nanometer level to the square micron level, and the fourth connection hole has a smaller size (larger than the third connection hole), which can further reduce damage and recombination to the second passivation layer 70 while ensuring good ohmic contact/electrical connection between the second finger 80 and the boron doped layer 60, and can improve photoelectric conversion efficiency compared with the traditional solar cells. Optionally, the projection area of each of the fourth connection holes on the second surface of the substrate layer 10 is 10 $nm^2$, 20 $nm^2$, 50 $nm^2$, 100 $nm^2$, 500 $nm^2$, 0.1 $\mu m^2$, 1 $\mu m^2$, 2 $\mu m^2$, 3 $\mu m^2$, 10 $\mu m^2$ or within a range of any of the above values.

In some embodiments, based on a projection area on the second surface of the substrate layer 10, the second fingers 80 per 1 $mm^2$ are electrically connected to the boron doped layer 60 through 1 to 100,000 fourth connection holes. Optionally, based on a projection area on the second surface of the substrate layer 10, the second fingers 80 per 1 $mm^2$ are electrically connected to the boron doped layer 60 through the third connection hole whose number is 1, 10, 100, 200, 500, 1,000, 2,000, 3,000, 5,000, 8,000, 10,000, 20,000, 30,000, 50,000, 80,000, 100,000 or within a range of any of the above values.

In some embodiments, a thickness of the second passivation layer 70 ranges from 2 nm to 20 nm. Optionally, the thickness of the second passivation layer 70 is 2 nm, 5 nm, 10 nm, 15 nm, 20 nm or within a range of any of the above values.

Referring to FIG. 1 to FIG. 8, in some embodiments, the solar cell 1 further includes an antireflection layer 90, and the antireflection layer 90 is arranged on a side of the second passivation layer 70 away from the substrate layer 10.

In some embodiments, a thickness of the antireflection layer 90 ranges from 40 nm to 100 nm. Optionally, the thickness of the antireflection layer 90 is 40 nm, 50 nm, 60 nm, 70 nm, 80 nm, 90 nm, 100 nm or within a range of any of the above values.

It may be understood that the solar cell including the antireflection layer 90 may be provided with or not provided with a connection hole. For the solution including the connection hole, the arrangement idea of the connection hole may be consistent with that of the fourth connection hole in the second passivation layer 70, and thus is also called the fourth connection hole. Along the thickness direction, the fourth connection hole in the antireflection layer 90 runs through part or all of the antireflection layer 90.

With reference to the description of the fourth connection hole in the second passivation layer, at least one fourth connection hole is provided in the antireflection layer 90 (since the second fingers and the fourth connection holes form a mosaic structure, the fourth connection holes are not shown in FIG. 4 to FIG. 8), and the second fingers 80 pass through the fourth connection holes and the third connection holes corresponding thereto to be electrically connected to the boron doped layer 60. In the second direction y, widths W04 of the fourth connection holes in the antireflection layer 90 are all less than or equal to widths W4 of the second fingers 80 corresponding to the third connection holes. Through the above arrangement, the second fingers 80 cause less damage to the antireflection layer 90, which can further reduce damage and recombination to the passivation structure of the solar cell 1.

Referring to FIG. 4 to FIG. 8, in some embodiments, along the thickness direction, the fourth connection hole runs through part of the antireflection layer 90 or all of the second passivation layer 70.

Referring to FIG. 4 to FIG. 8, in some embodiments, at least one fifth hole is provided in the first passivation layer 40, bottoms of the fifth holes are located in the first passivation layer 40, and widths W05 of the fifth holes are all less than widths W2 of the first fingers 50 corresponding to the first connection hole.

Figure 4:
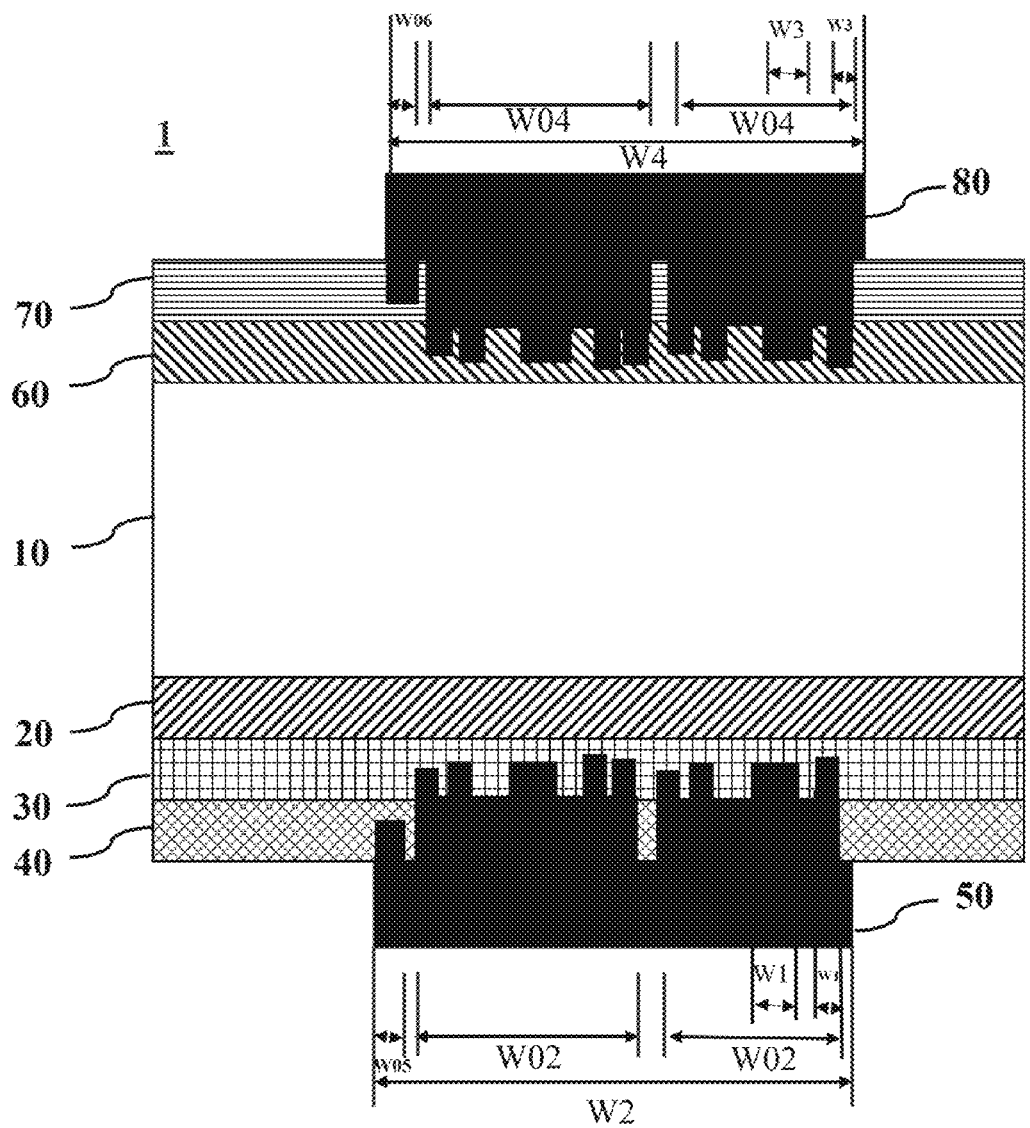
FIG. 4 is a schematic structural diagram of a solar cell according to an embodiment of the present disclosure.
Figure 5A:
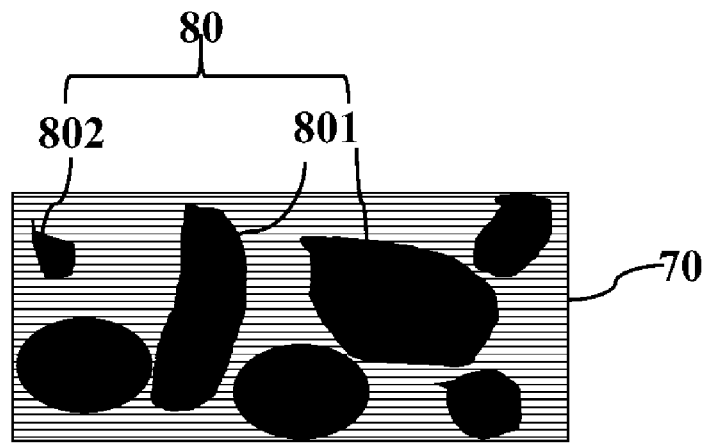
FIG. 5A is a top view below a coverage region of second fingers of the solar cell shown in FIG. 4.
Figure 5B:
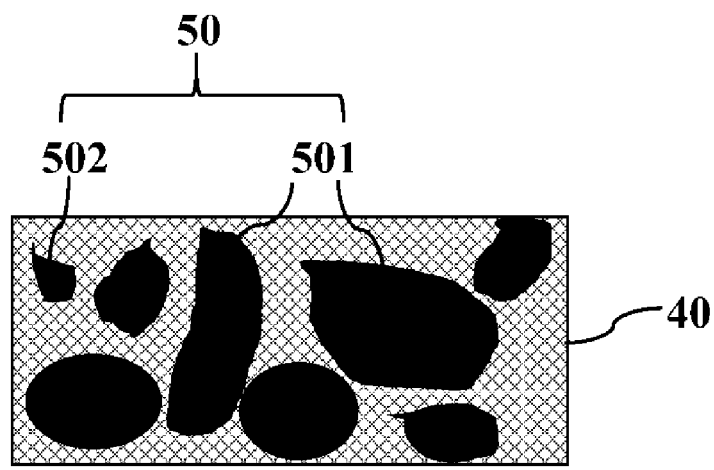
FIG. 5(B) is a top view below a coverage region of first fingers of the solar cell shown in FIG. 4.

Referring to FIG. 4, in some embodiments, at least one sixth hole is provided in the second passivation layer 70, bottoms of the sixth holes are located in the second passivation layer 70, and widths W06 of the sixth holes are all less than widths W4 of the second fingers 80 corresponding to the third connection hole.

Figure 6:
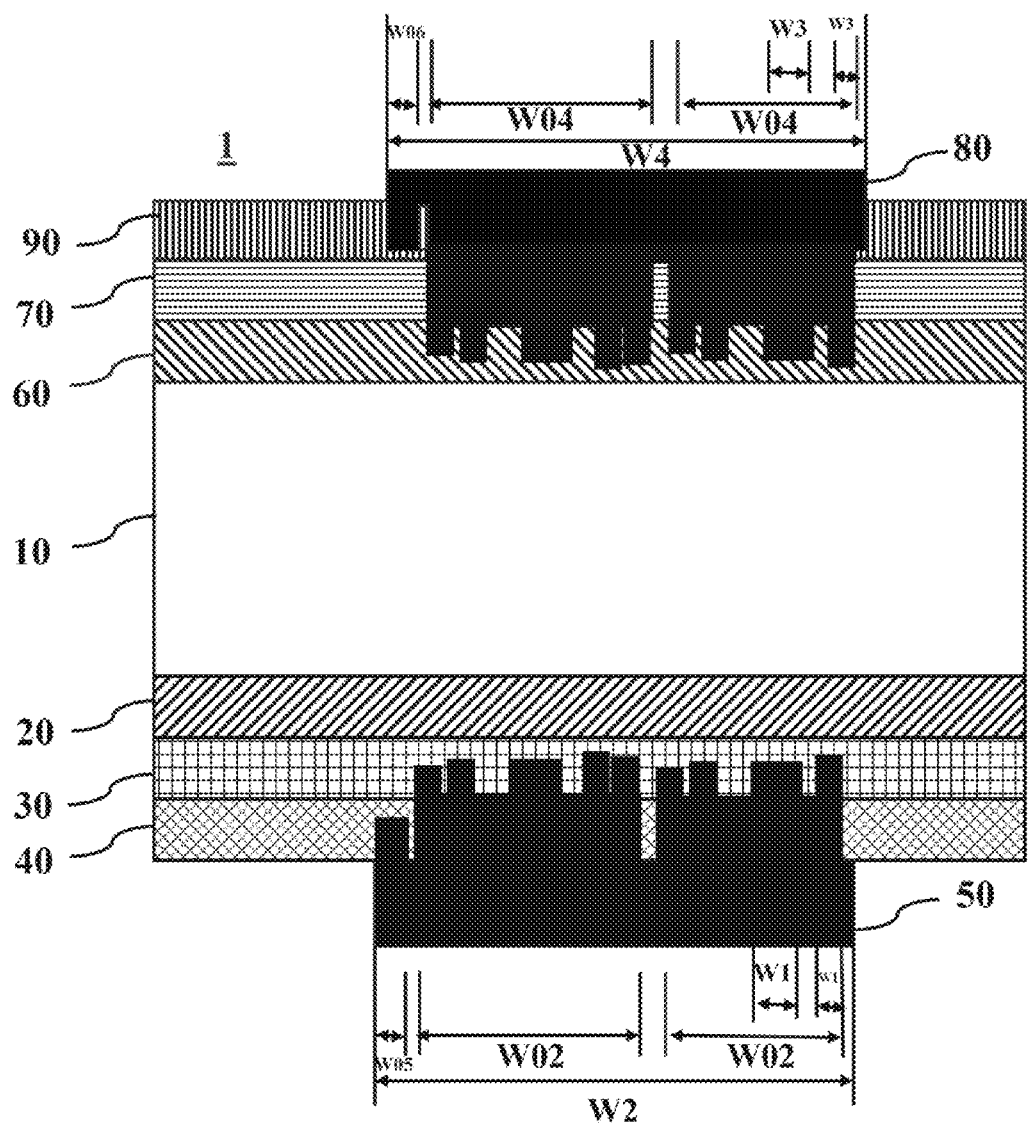
FIG. 6 is a schematic structural diagram of a solar cell according to an embodiment of the present disclosure.
Figure 7A:
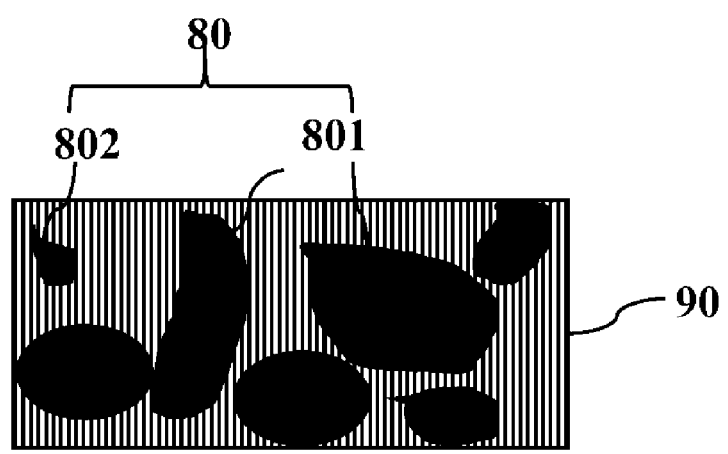
FIG. 7A is a top view below a coverage region of second fingers of the solar cell shown in FIG. 6.
Figure 7B:
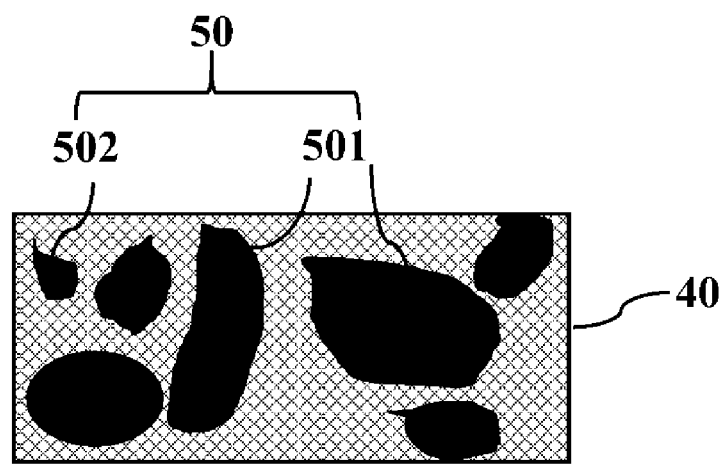
FIG. 7B is a top view below a coverage region of first fingers of the solar cell shown in FIG. 6.

Referring to FIG. 6, in some embodiments, at least one sixth hole is provided in the antireflection layer 90, bottoms of the sixth holes are located in the antireflection layer 90, and widths W06 of the sixth holes are all less than widths W4 of the second fingers 80 corresponding to the third connection hole.

Figure 8:
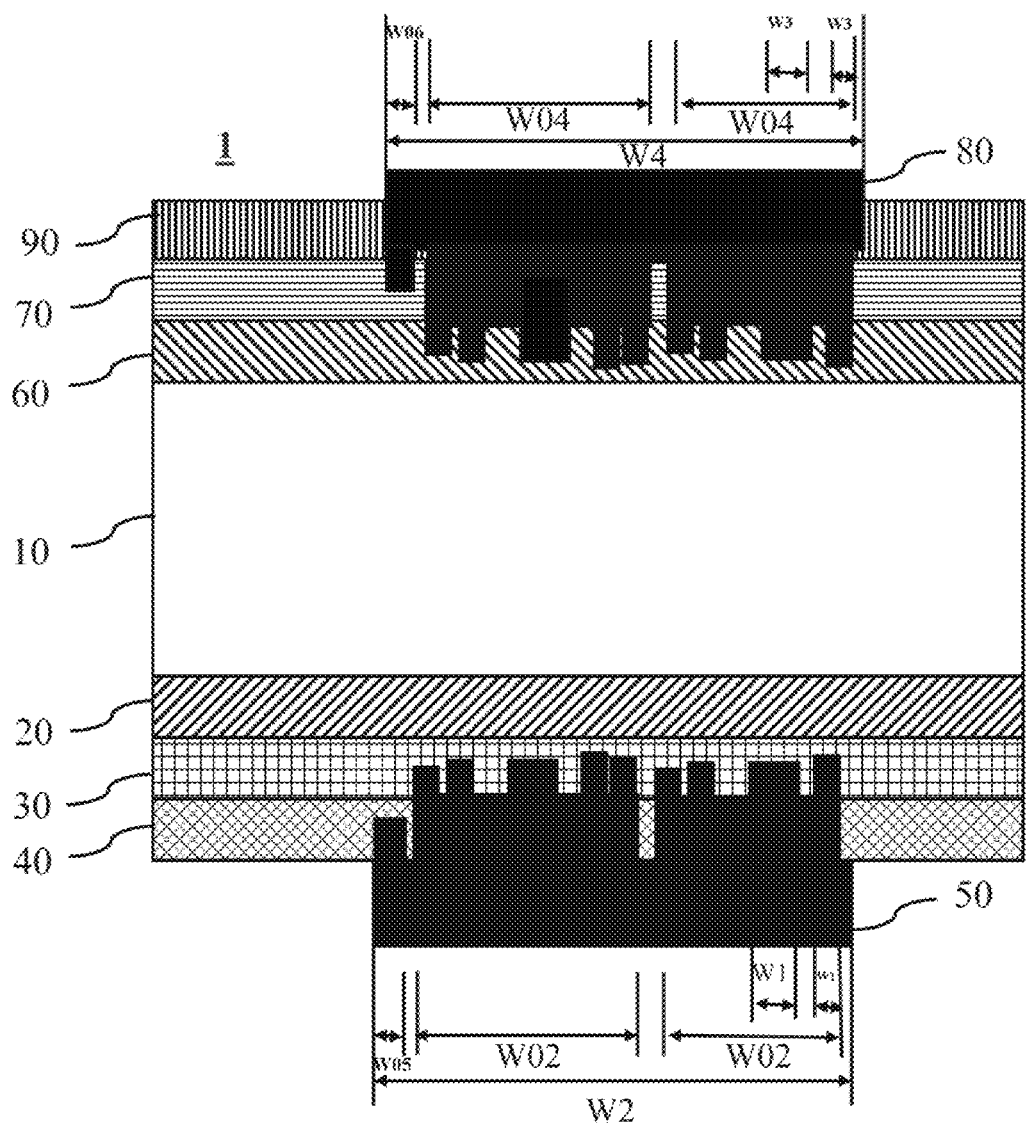
FIG. 8 is a schematic structural diagram of a solar cell according to an embodiment of the present disclosure.

Referring to FIG. 8, in some embodiments, at least one sixth hole is provided in the second passivation layer 70 and the antireflection layer 90, bottoms of the sixth holes are located in the second passivation layer 70, and widths W06 of the sixth holes are all less than widths W4 of the second fingers 80 corresponding to the third connection hole.

In some embodiments, the solar cell 1 further includes at least one first busbar (not shown). The first busbar is connected to each first finger 50 in the first finger electrode layer.

In some embodiments, the solar cell 1 further includes at least one second busbar (not shown). The second busbar is connected to each second finger 80 in the second finger electrode layer.

In some embodiments, the solar cell 1 is a TOPCon cell.

In some embodiments, the substrate layer 10 is an N-type monocrystalline silicon wafer.

In some embodiments, the second surface of the substrate layer 10 has a textured structure. The second surface of the textured structure can improve utilization of light by the solar cell 1 and improve photoelectric conversion efficiency.

In some embodiments, the tunnel oxide layer 20 is an ultra-thin silicon oxide film.

In some embodiments, a material of the first passivation layer 40 includes at least one of silicon nitride, silicon oxynitride, and silicon oxide. In some embodiments, the material of the first passivation layer 40 is silicon nitride.

In some embodiments, a material of the first doped polysilicon layer 30 is phosphorus-doped polysilicon.

In some embodiments, the second passivation layer 70 is an aluminum oxide passivation film.

In some embodiments, a material of the antireflection layer 90 includes at least one of silicon nitride, silicon oxynitride, and silicon oxide. In some embodiments, the material of the antireflection layer 90 is silicon nitride.

In some embodiments, the first finger 50 includes at least one of a metal element and a metal alloy. Optionally, the first finger 50 includes one of a silver element, an aluminum element, and a silver-aluminum alloy. Further, the first busbar includes a silver element.

In some embodiments, the second finger 80 includes at least one of a metal element and a metal alloy. Optionally, the second finger 80 includes one of a silver element, an aluminum element, and a silver-aluminum alloy. Further, the second finger 80 includes the silver-aluminum alloy.

In a second aspect, the present disclosure further provides a manufacturing method for a solar cell 1, including the following steps S110 to S140.

In S110, a tunnel oxide layer 20, a first doped polysilicon layer 30, and a first passivation layer 40 are sequentially formed on a first surface of a substrate layer 10.

In S120, a first pattern is printed on a surface of the first passivation layer 40 away from the substrate layer 10, a material of the first pattern including a first metal slurry; the first pattern including a plurality of first finger bars sequentially arranged at intervals along a first direction.

In S130, the first pattern is dried.

In S140, the dried first pattern is sintered, and a first finger electrode layer is manufactured, the first finger 50 layer including a plurality of first fingers 50 sequentially arranged at intervals along the first direction, each of the first fingers 50 corresponding to one of the first finger bars.

In the sintering, the material of the first pattern corrodes the first passivation layer 40 and the first doped polysilicon layer 30, at least one first connection hole is etched in the first passivation layer 40 and the first doped polysilicon layer 30 at a position corresponding to at least one of the first finger bars, bottoms of the first connection holes are located in the first doped polysilicon layer 30, and the manufactured first fingers 50 pass through the first connection holes corresponding thereto to be in contact with the first doped polysilicon layer 30.

In the above manufacturing method for a solar cell 1, in the sintering, the first passivation layer 40 is etched with a raw material for manufacturing the finger to form a first connection hole, so that the first finger 50 passes through the first connection hole and contacts the first doped polysilicon layer 30. During the manufacturing, there is no need to remove the first passivation layer 40 through etching or laser ablation, and the ohmic contact between the first finger 50 and the first doped polysilicon layer 30 can be achieved through sintering. The manufacturing method causes less damage and recombination to the first passivation layer 40, and the manufactured solar cell 1 has higher photoelectric conversion efficiency.

In some embodiments, a peak temperature of the sintering ranges from 700° C. to 900° C. Optionally, the peak temperature of the sintering is 700° C., 750° C., 800° C., 850° C., 900° C. or within a range of any of the above values.

In some embodiments, prior to step S120, the method further includes the following steps.

In step S114, a first busbar pattern is printed on a surface of the first passivation layer 40 away from the substrate layer 10.

In step S116, the first busbar pattern is dried.

In some embodiments, prior to step S120, the method further includes the following steps.

In step S210, a boron doped layer 60 and a second passivation layer 70 are sequentially formed on a second surface of the substrate layer 10.

In some embodiments, step S112 further includes forming an antireflection layer 90 on a surface of the second passivation layer 70.

In some embodiments, prior to step S140, the method further includes the following steps.

In S220, a second pattern is printed on a surface of the second passivation layer 70 or the antireflection layer 90 away from the substrate layer 10, a material of the second pattern including a second metal slurry; the second pattern including a plurality of second finger bars sequentially arranged at intervals along a second direction.

In step S230, the second pattern is dried.

In some embodiments, prior to step S220, the method further includes the following steps.

In step S212, a second busbar pattern is printed on a surface of the second passivation layer 70 or the antireflection layer 90 away from the substrate layer 10. In step S214, the second busbar pattern is dried.

In some embodiments, in step S140, while the dried first pattern is being sintered, the dried second pattern is sintered to manufacture a second finger electrode layer.

For example, the present disclosure provides a manufacturing method for a TOPCon cell, including the following steps.

(1) An N-type monocrystalline silicon wafer is cleaned and textured.

(2) A front surface of the N-type monocrystalline silicon wafer is treated through a boron diffusion process.

(3) A back surface is cleaned to remove a borosilicate glass (BSG) layer.

(4) The back surface is oxidized to manufacture an ultra-thin silicon oxide layer, and phosphorus-doped polysilicon is deposited to form an n+ polysilicon layer.

(5) A passivation layer and an antireflection layer are deposited on the front surface in sequence.

(6) A passivation layer is deposited on the back surface.

(7) A back busbar electrode is screen-printed and dried. Then, a back finger electrode is printed and dried.

(8) A front busbar electrode is screen-printed and dried. Then, a front finger electrode is printed and dried.
(9) A silicon wafer printed with busbar and finger electrodes is sintered, a peak temperature of the sintering is controlled to 700° C. to 900° C., and a solar cell is manufactured.
(10) The solar cell manufactured in step (9) is tested and sorted.

In a third aspect, the present disclosure further provides a photovoltaic system, including the solar cell 1 described above or a solar cell 1 manufactured according to the manufacturing method for a solar cell 1 described above.

The photovoltaic system may be applied to photovoltaic power stations, such as ground power stations, roof power stations, and water surface power stations, and may also be applied to device or apparatuses that use solar energy to generate electricity, such as user solar power supplies, solar street lights, solar cars, and solar buildings. Certainly, it may be understood that the application scenarios of the photovoltaic system are not limited to the above. In other words, the photovoltaic system may be applied to all fields where solar energy is required to generate electricity. Taking a photovoltaic power generation network as an example, the photovoltaic system may include a photovoltaic array, a combiner box, and an inverter. The photovoltaic array may be an array combination of a plurality of solar cells 1. For example, a plurality of solar cells 1 may form a plurality of photovoltaic arrays. The photovoltaic arrays are connected to the combiner box. The combiner box may combine currents generated by the photovoltaic arrays. The combined current flows through the inverter and is converted into an alternating current required by a mains power grid, and then connected to a mains network to realize solar power supply.

The following are specific embodiments.

Embodiment 1

This embodiment provides a solar cell 1, a structure of which is shown in FIG. 1 to FIG. 3. The solar cell 1 includes a substrate layer 10 (N-type monocrystalline silicon wafer), a tunnel oxide layer 20, an n+ polysilicon layer, a first passivation layer 40 (silicon nitride), a boron doped layer 60 (p-type emitter), a second passivation layer 70 (aluminum oxide), and an antireflection layer 90 (silicon nitride).

The tunnel oxide layer 20, the n+ polysilicon layer, and the first passivation layer 40 (silicon nitride) are sequentially arranged on a first surface of the substrate layer 10 in a direction gradually away from the substrate layer 10.

The boron doped layer 60 (p-type emitter), the second passivation layer 70 (aluminum oxide), and the antireflection layer 90 (silicon nitride) are sequentially arranged on a second surface of the substrate layer 10 in a direction gradually away from the substrate layer 10.

A chip with the above structure is manufactured by sequentially performing cleaning and texturing; front boron diffusion; back cleaning; back deposition of silicon dioxide and polysilicon; back phosphorus diffusion; cleaning; front coating; back coating, and other processes on the substrate layer 10.

The solar cell 1 in this embodiment further includes a front busbar, a front finger, a back busbar, and a back finger. In the first direction x, a surface of the first passivation layer 40 is provided with a plurality of back fingers arranged at intervals along the first direction x. In the second direction y, a surface of the antireflection layer 90 is provided with a plurality of front fingers arranged at intervals along the first direction y.

At least one first connection hole is provided at positions where the first passivation layer 40 corresponds to the back fingers, the back fingers are electrically connected to the first doped polysilicon layer 30 through the first connection hole, and in the first direction x, a width W1 of the connection hole is less than a width W2 of the back finger. The back busbar is connected to the back finger. A projection area of the first connection hole on the first surface of the substrate layer 10 ranges from 10 nm$^2$ to 10 μm$^2$.

At least one third connection hole is provided at positions where the antireflection layer 90 and the second passivation layer 70 correspond to the front fingers, the front fingers are electrically connected to the boron doped layer 60 through the third connection hole, and in the second direction y, a width W3 of the third connection hole is less than a width W4 of the front finger. The front busbar is connected to the front finger. A projection area of the third connection hole on the second surface of the substrate layer 10 ranges from 10 nm$^2$ to 10 μm$^2$.

Specifically, a manufacturing process for the front busbar, the front finger, the back busbar, and the back finger in the above solar cell includes the following steps.

(1) A busbar silver slurry is screen-printed on a back surface of the silicon wafer, and a back busbar electrode is manufactured and dried. Then, a finger silver slurry is printed on the back surface, and a back finger electrode is manufactured and dried.
(2) A busbar silver slurry is screen-printed on a front surface of the silicon wafer, and a front busbar electrode is manufactured and dried. Then, a finger silver slurry is printed on the front surface, and a front finger electrode is manufactured and dried.
(3) A cell with double-sided printed electrodes is sintered, heated to above 700° C. at a rate of more than 50° C./min, and then cooled to room temperature at a rate of more than 50° C./min to obtain the solar cell of this embodiment.

Comparative Example 1

The structure of the chip of the solar cell provided in this comparative example is the same as that in Embodiment 1. Different from Embodiment 1, the front finger and the back finger have different structures.

In the solar cell of this comparative example, connection grooves are respectively provided at positions where the first passivation layer corresponds to the back fingers, the back fingers are connected to the first doped polysilicon layer through the connection grooves, and widths of the connection grooves are equal to widths of the back fingers. That is, in a region corresponding to the back fingers, a surface of the first doped polysilicon layer is not covered with the first passivation layer. The back busbar is connected to the back finger.

connection grooves are respectively provided at positions where the antireflection layer and the second passivation layer correspond to the front fingers, the front fingers are connected to the boron doped layer through the connection grooves, and widths of the connection grooves are equal to widths of the front fingers. That is, in a region corresponding to the front fingers, a surface of the boron doped layer is not covered with the second passivation layer and the antireflection layer. The front busbar is connected to the front finger.

Specifically, a manufacturing process for the front busbar, the front finger, the back busbar, and the back finger in the above solar cell includes the following steps.

(1) On a back surface of the silicon wafer, by screen printing, a back busbar electrode is manufactured and dried. Then, by printing on the back surface, a back finger electrode is manufactured and dried.

(2) A slurry is screen-printed on a front surface of the silicon wafer, and a front busbar electrode is manufactured and dried. Then, a slurry is printed on the front surface, and a front finger electrode is manufactured and dried.

(3) A cell with double-sided printed electrodes is sintered, heated to 800° C. at a rate of 1500° C./min and kept for 1 minute, and then cooled to 25° C. at a rate of 2500° C./min to obtain the solar cell of this embodiment.

Through electrical performance testing of the solar cells of Embodiment 1 and Comparative Example 1, it is found that average efficiency of mass production of solar cells in Embodiment 1 is 25.5%, and compared with the solar cell of Comparative Example 1, an open-circuit voltage of the solar cell of Embodiment 1 is increased by 2 mV, a filling factor is increased by 0.1%, and photoelectric conversion efficiency of the cell is increased by 0.1%.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present disclosure, and their description is specific and detailed, but cannot therefore be understood as a limitation on the patent scope of the present disclosure. It should be noted that those of ordinary skill in the art may further make variations and improvements without departing from the conception of the present disclosure, and these all fall within the protection scope of the present disclosure. It should be understood that the technical solutions obtained by logical analysis, reasoning or limited experiments by those skilled in the art based on the technical solutions provided in the present disclosure are within the protection scope of the appended claims of the present disclosure. Therefore, the patent protection scope of the present disclosure should be subject to the contents of the appended claims, and the specification and the accompanying drawings may be used to interpret contents of the claims.

The invention claimed is:

1. A solar cell, comprising:
a substrate layer comprising a first surface and a second surface arranged oppositely along a thickness direction thereof;
a tunnel oxide layer, a first doped polysilicon layer, and a first passivation layer sequentially arranged on the first surface of the substrate layer in a direction gradually away from the substrate layer; and
a first finger electrode layer, the first finger electrode layer comprising a plurality of first fingers sequentially arranged at intervals along a first direction;
at least one first connection hole being provided in the first passivation layer and the first doped polysilicon layer, along the thickness direction, the first connection hole running through all of the first passivation layer and running through part of the first doped polysilicon layer, bottoms of the first connection holes being located in the first doped polysilicon layer, and the first fingers passing through the first connection holes corresponding thereto to be electrically connected to the first doped polysilicon layer; and in the first direction, widths of the first connection holes being all less than widths of the first fingers corresponding to the first connection holes;
the projection area of each of the first connection holes on the first surface independently ranges from 10 nm$^2$ to 10 μm$^2$.

2. The solar cell according to claim 1, wherein based on a projection area on the first surface, the first fingers per 1 mm$^2$ are electrically connected to the first doped polysilicon layer through 1 to 100,000 first connection holes.

3. The solar cell according to claim 1, wherein at least one second connection hole is provided in the first passivation layer, and the first fingers pass through the second connection holes and the first connection holes corresponding thereto to be electrically connected to the first doped polysilicon layer; and in the first direction, widths of the second connection holes are all less than or equal to widths of the first fingers corresponding to the second connection holes; and
projections of the first connection holes on the first surface all fall within a projection range of the second connection holes on the first surface.

4. The solar cell according to claim 3, wherein a number of the second connection holes is less than that of the first connection holes.

5. The solar cell according to claim 3, further comprising: a boron doped layer, a second passivation layer, and a second finger electrode layer;
the boron doped layer and the second passivation layer being sequentially arranged on the second surface of the substrate layer in a direction gradually away from the substrate layer, and the second finger electrode layer comprising a plurality of second fingers arranged at intervals along a second direction; and
at least one third connection hole being provided in the second passivation layer and the boron doped layer, along the thickness direction, the third connection hole running through all of the second passivation layer and running through part of the boron doped layer, bottoms of the third connection holes being located in the boron doped layer, and the second fingers passing through the third connection holes corresponding thereto to be electrically connected to the boron doped layer; and in the second direction, widths of the third connection holes being all less than widths of the second fingers corresponding to the third connection holes.

6. The solar cell according to claim 5, wherein a projection area of each of the third connection holes on the second surface is independently from a square nanometer level to a square micron level.

7. The solar cell according to claim 6, wherein the projection area of each of the third connection holes on the second surface independently ranges from 10 nm$^2$ to 10 μm$^2$.

8. The solar cell according to claim 5, wherein based on a projection area on the second surface, the second fingers per 1 mm$^2$ are electrically connected to the boron doped layer through 1 to 100,000 third connection holes.

9. The solar cell according to claim 5, wherein at least one fourth connection hole is provided in the second passivation layer, and the second fingers pass through the fourth connection holes and the third connection holes corresponding thereto to be electrically connected to the boron doped layer; and in the second direction, widths of the fourth connection holes are all less than or equal to widths of the second fingers corresponding to the third connection holes; and projections of the third connection holes on the second surface all fall within a projection range of the fourth connection holes on the second surface.

10. The solar cell according to claim 5, wherein a thickness of the second passivation layer ranges from 2 nm to 20 nm.

11. The solar cell according to claim 1, wherein a combination of one or more of the following (1) to (2) is satisfied:
   (1) a thickness of the first passivation layer ranges from 40 nm to 100 nm; and
   (2) a thickness of the first doped polysilicon layer ranges from 10 nm to 200 nm.

12. The solar cell according to claim 5, further comprising: an antireflection layer;
   the antireflection layer being arranged on a side of the second passivation layer away from the substrate layer.

13. The solar cell according to claim 12, wherein a thickness of the antireflection layer ranges from 40 nm to 100 nm.

14. The solar cell according to claim 1, wherein the substrate layer is an N-type monocrystalline silicon wafer.

15. A photovoltaic system, comprising the solar cell according to claim 1.

16. A manufacturing method for a solar cell, comprising the following steps:
   sequentially forming a tunnel oxide layer, a first doped polysilicon layer, and a first passivation layer on a first surface of a substrate layer;
   printing a first pattern on a surface of the first passivation layer away from the substrate layer, a material of the first pattern comprising a first metal slurry; the first pattern comprising a plurality of first finger bars sequentially arranged at intervals along a first direction;
   drying the first pattern; and
   sintering the dried first pattern, and manufacturing a first finger electrode layer, the first finger electrode layer comprising a plurality of first fingers sequentially arranged at intervals along the first direction, each of the first fingers corresponding to one of the first finger bars;
   wherein, in the sintering, the material of the first pattern corrodes the first passivation layer and the first doped polysilicon layer, at least one first connection hole is etched in the first passivation layer and the first doped polysilicon layer at a position corresponding to at least one of the first finger bars, bottoms of the first connection holes are located in the first doped polysilicon layer, and the manufactured first fingers pass through the first connection holes corresponding thereto to be in contact with the first doped polysilicon layer; and in the first direction, widths of the first connection holes being all less than widths of the first fingers corresponding to the first connection holes;
   a projection area of each of the first connection holes on the first surface independently ranging from 10 $nm^2$ to 10 $\mu m^2$.

17. The manufacturing method for the solar cell according to claim 16, wherein a peak temperature of the sintering ranges from 700° C. to 900° C.

* * * * *